(12) United States Patent
Lim et al.

(10) Patent No.: US 11,462,285 B2
(45) Date of Patent: Oct. 4, 2022

(54) MEMORY DEVICE AND METHOD OF OPERATING THE MEMORY DEVICE

(71) Applicant: SK hynix Inc., Icheon-si Gyeonggi-do (KR)

(72) Inventors: Sungmook Lim, Icheon-si Gyeonggi-do (KR); In Gon Yang, Icheon-si Gyeonggi-do (KR); Jae Hyeon Shin, Icheon-si Gyeonggi-do (KR); Hyung Jin Choi, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/197,957

(22) Filed: Mar. 10, 2021

(65) Prior Publication Data
US 2022/0084612 A1 Mar. 17, 2022

(30) Foreign Application Priority Data
Sep. 14, 2020 (KR) .................. 10-2020-0117889

(51) Int. Cl.
*G11C 16/04* (2006.01)
*G11C 29/02* (2006.01)
*G11C 16/26* (2006.01)
*G11C 16/24* (2006.01)

(52) U.S. Cl.
CPC ........ *G11C 29/026* (2013.01); *G11C 16/0483* (2013.01); *G11C 16/24* (2013.01); *G11C 16/26* (2013.01)

(58) Field of Classification Search
CPC ... G11C 29/026; G11C 16/0483; G11C 16/24; G11C 16/26
See application file for complete search history.

(56) References Cited

U.S. PATENT DOCUMENTS

| | | | | |
|---|---|---|---|---|
| 2010/0302866 A1* | 12/2010 | Cha | ........................ | G11C 29/02 365/201 |
| 2011/0128805 A1* | 6/2011 | Yoon | ...................... | G11C 29/02 365/207 |
| 2013/0163331 A1* | 6/2013 | Yoo | .................... | G11C 16/3459 365/185.11 |

FOREIGN PATENT DOCUMENTS

| | | |
|---|---|---|
| KR | 100816138 B1 | 3/2008 |
| KR | 100935722 B1 | 1/2010 |

* cited by examiner

*Primary Examiner* — Uyen Smet
(74) *Attorney, Agent, or Firm* — William Park & Associates Ltd.

(57) ABSTRACT

The present technology relates to an electronic device. For example, the present technology relates to a memory device and a method of operating the memory device. A memory device according to an embodiment includes a memory cell, a page buffer, and a test performer configured to control the page buffer to sequentially apply a first test voltage and a second test voltage of a level lower than a level of the first test voltage to a sensing node of the page buffer through a bit line, and detect a defect of the sensing node according to whether a potential level of the sensing node is changed.

13 Claims, 13 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0117889, filed on Sep. 14, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under control of a host device. The storage device may include a memory device storing data and a memory controller controlling the memory device. The memory device may be classified into a volatile memory device and a nonvolatile memory device.

The volatile memory device may store data only while receiving power from a power source. When the power supply is cut off, the data stored in the volatile memory device may be lost. The volatile memory device may include a static random access memory (SRAM), a dynamic random access memory (DRAM), and the like.

The nonvolatile memory device may be a device in which the data is not lost even though power of the power source is cut off. The nonvolatile memory device may include a read only memory (ROM), a programmable ROM (PROM), an electrically programmable ROM (EPROM), an electrically erasable and programmable ROM (EEPROM), a flash memory, and the like.

SUMMARY

A memory device according to an embodiment of the present disclosure may include a memory cell connected to a bit line, a page buffer configured to store data to be stored in the memory cell, and a test performer configured to control the page buffer to sequentially apply a first test voltage and a second test voltage of a level lower than a level of the first test voltage to a sensing node of the page buffer through the bit line, and detect a defect of the sensing node according to whether a potential level of the sensing node is changed, and the page buffer may include a test voltage transfer component configured to transmit the first test voltage or the second test voltage to the sensing node, a sensing node connector configured to electrically connect the bit line and the sensing node, and a sensing latch configured to latch a sensing value corresponding to the potential level of the sensing node and provide the sensing value to the test performer.

A method of operating a memory device according to an embodiment of the present disclosure may include sequentially applying a first test voltage and a second test voltage of a level lower than a level of the first test voltage to a sensing node of a page buffer through a bit line, and detecting a defect of the sensing node according to whether a potential level of the sensing node is changed to be less than a preset reference level.

DETAILED DESCRIPTION

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and the descriptions are not limited to the embodiments described in the present specification or application.

An embodiment of the present disclosure provides a memory device preventing performance reduction by sensing a defect of a sensing node, and a method of operating the same.

According to the present technology, a memory device preventing performance reduction by sensing a defect of a sensing node, and a method of operating the same are provided.

Figure 1:
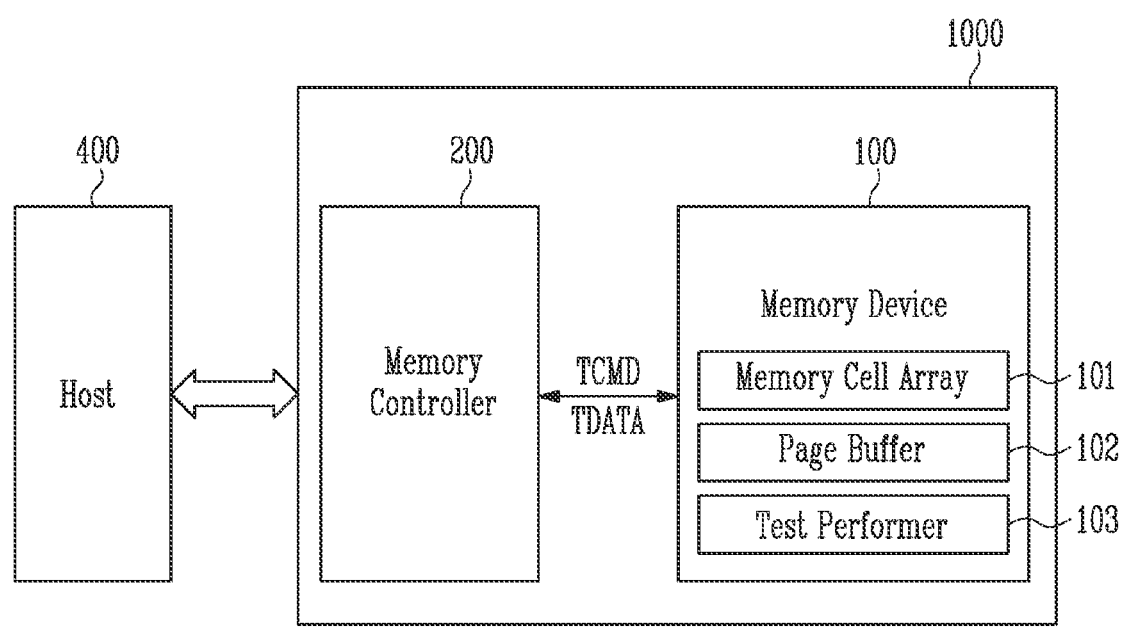
FIG. 1. is a diagram illustrating a storage system according to an embodiment of the present disclosure.

FIG. 1 is a diagram illustrating a storage system according to an embodiment of the present disclosure.

Referring to FIG. 1, the storage system may be implemented as a personal computer (PC), a data center, a corporate data storage system, a data processing system including a direct attached storage (DAS), a data processing system including a storage area network (SAN), and a data processing system including a network attached storage (NAS), or the like.

The storage system may include a storage device 1000 and a host 400.

The storage device 1000 may be a device that stores data according to a request of the host 400 such as a cellular phone, a smartphone, an MP3 player, a laptop computer, a desktop computer, a game player, a TV, a tablet PC, or an in-vehicle infotainment system.

The storage device 1000 may be manufactured as one of various types of storage devices according to a host interface that is a communication method with the host 400. For example, the storage device 1000 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 1000 may be manufactured as any one of various types of packages. For example, the storage device 1000 may be manufactured as any one of various types of package types, such as a package on package (POP), a system in package (SIP), a system on chip (SOC), a Min clip package (MCP), a chip on board (COB), a wafer-level fabricated package (WFP), and a wafer-level stack package (WSP).

The storage device 1000 may include a memory device 100 and a memory controller 200.

The memory device 100 may operate in response to control of the memory controller 200. For example, the memory device 100 may receive a command and an address from the memory controller 200 and access a memory cell selected by the address among memory cells (not shown). The memory device 100 may perform an operation instructed by the command on the memory cell selected by the address.

The command may be, for example, a program command, a read command, or an erase command, and the operation instructed by the command may be, for example, a program operation (or a write operation), a read operation, or an erase operation.

For example, the memory device 100 may receive the program command, an address, and data, and program the data in a memory cell selected by the address. Here, data to be programmed in the selected memory cell may be defined as write data.

For example, the memory device 100 may receive the read command and an address, and read data from a region selected by the address in the memory cell array 101. Data to be read from the selected region among data stored in the memory device 100 may be defined as read data.

For example, the memory device 100 may receive the erase command and an address, and erase data stored in a region selected by the address.

For example, the memory device 100 may be implemented with a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), a NAND flash memory, a vertical NAND flash memory (vertical NAND), a NOR flash memory, a resistive random access memory (RRAM), a phase-change random access memory (PRAM), a magnetoresistive random access memory (MRAM), a ferroelectric random access memory, a spin transfer torque random access memory (STT-RAM), and the like.

In the present specification, for convenience of description, it is assumed that the memory device 100 is a NAND flash memory.

The memory device 100 may store the write data under control of the memory controller 200, or read the stored read data and provide the read data to the memory controller 200.

The memory device 100 may include at least one plane. One plane may include a memory cell array 101 including memory cells storing data.

The memory cell array 101 may include a plurality of memory blocks (not shown). The memory block may be a unit that performs an erase operation of erasing data.

The memory block may include a plurality of pages (not shown). The page may be a unit that performs the program operation of storing the write data or the read operation of reading the stored read data.

The memory device 100 may perform a test operation of detecting a defect of a sensing node (not shown) of the page buffer 102 in response to a test command TCMD provided from an external controller. To this end, the memory device 100 may include a test performer 103.

As an embodiment, the test performer 103 may control the page buffer 102 to sequentially apply a first test voltage and a second test voltage to the sensing node of the page buffer 102 and detect the defect of the sensing node according to whether a potential level of the sensing node is changed, in response to the test command TCMD input from the external controller.

In an embodiment, the second test voltage may be a voltage of a level lower than that of the first test voltage.

In an embodiment, when the potential level of the sensing node is changed, the test performer 103 may detect that the sensing node is defective. For example, when the potential level of the sensing node is reduced from the first level to a second level lower than the first level, the test performer 103 may detect that the sensing node is defective.

In an embodiment, when the potential level of the sensing node is not changed, the test performer 103 may detect that the sensing node is normal.

After performing the test operation, the memory device 100 may provide test data TDATA to the external controller as a response to the test command TCMD.

The test data TDATA may be data indicating completion of the test operation, data related to a state of the sensing node of the page buffer 102, or data indicating information on the sensing node detected as a defective sensing node, Here, the state of the sensing node may be, for example, a normal state or a defective state.

In an embodiment, when the defect of the sensing node is detected, the memory device 100 may store data related to the defective sensing node, and may provide the data related to the defective sensing node to the external controller as the test data TDATA in response to control of the external controller.

In an embodiment, the number of page buffers 102 may be plural. Accordingly, the memory device 100 may output the test data TDATA for states of each of the sensing nodes to the external controller. Alternatively, the memory device 100 may selectively output the test data TDATA for the states of each of the sensing nodes to the external controller.

As an embodiment, the external controller may be a test controller that tests the memory device 100 in a manufacturing step of the memory device 100.

As an embodiment, the external controller may be the memory controller 200.

The memory controller 200 may control an overall operation of the storage device 1000.

When power is applied to the storage device 1000, the memory controller 200 may execute firmware. When the memory device 100 is a flash memory device, the firmware may include a host interface layer, a flash translation layer, and a flash interface layer.

The host interface layer may control an operation between the host 400 and the memory controller 200.

The flash translation layer may convert a logical address provided from the host 400 into a physical address, To this end, the memory controller 200 may store map data that is a correspondence relationship between the logical address and the physical address.

The flash interface layer may control communication between the memory controller 200 and the memory device 100.

The memory controller 200 may control the memory device 100 to perform the program operation, the read operation, and the erase operation, respectively, in response to a write request, a read request, and an erase request of the host 400.

During the program operation, the memory controller 200 may provide the program command, the physical addresses, and the write data to the memory device 100.

During the read operation, the memory controller 200 may provide the read command and the physical address to the memory device 100.

In the erase operation, the memory controller 200 may provide the erase command and the physical address to the memory device 100.

The memory controller 200 may generate the command, the addresses, and data autonomously regardless of a request provided from the host 400. The memory controller 200 may transmit the autonomously generated command, address, and data to the memory device 100.

For example, the memory controller 200 may generate a command, an addresses, and data for performing a background operation. In addition, the memory controller 200 may provide the command, the address, and the data to the memory device 100.

The background operation may be at least one of wear leveling, read reclaim, or garbage collection.

The wear leveling may mean an operation of storing the number of times of erasing memory blocks and programming data in a memory block having the lowest number of times of erasing.

The read reclaim may mean an operation of moving data stored in a memory block to another memory block before an uncorrectable error occurs in data stored in a memory block.

The garbage collection may mean an operation of copying valid data included in a bad block among memory blocks to a free block and erasing invalid data included in the bad block.

The memory controller 200 may control two or more memory devices 100. In this case, the memory controller 200 may control the memory devices 100 according to an interleaving method to improve operation performance.

The interleaving method may be a method of controlling operations of two or more memory devices 100 to overlap.

In an embodiment, in response to a test request of the host 400, the memory controller 200 may provide the test command TCMD instructing to perform the test operation to the memory device 100.

In an embodiment, the memory controller 200 may provide the test command TCMD to the memory device 100 in response to that the storage device 1000 corresponds to an end of life (EOL). Here, the EOL may mean a stage in which a life of the storage device 1000 approaches an end.

Based on the test data TDATA provided from the memory device 100, the memory controller 200 may provide a control command (not shown) instructing to limit an operation of the page buffer 102 having the sensing node detected as the defective sensing node to the memory device 100.

Although not shown, the storage device 1000 may further include a buffer memory. For example, the buffer memory may be implemented with any one of a double data rate synchronous dynamic random access memory (DDR SDRAM), a low power double data rate4 (LPDDR4) SDRAM, a graphics double data rate (DDDR) SDRAM, a low power DDR (LPDDR), and a Rambus dynamic random access memory (RDRAM).

The host 400 may communicate with the storage device 1000 through an interface (not shown).

The interface may be implemented with a serial advanced technology attachment (SATA) interface, a SATA express (SATA express) interface, a serial attached small computer system interface (SAS) interface, a peripheral component interconnect express (PCIe) interface, a nonvolatile memory express (NVMe) interface, an advanced host controller interface (AHCI), or a multimedia card interface. However, the interface is not limited thereto.

The host 400 may communicate with the storage device 1000 to store the write data in the storage device 1000 or obtain the read data stored in the storage device 1000.

In an embodiment, the host 400 may provide the write request to the storage device 1000 for requesting to store the write data in the storage device 1000. In addition, the host 400 may provide the write request, the write data, and a logical address for identifying the write data to the storage device 1000.

The storage device 1000 may store the write data provided by the host 400 in the memory device 100 in response to the write request provided from the host 400 and provide a response that the storage is completed to the host 400.

In an embodiment, the host 400 may provide the read request to the storage device 1000 for requesting to provide the data stored in the storage device 1000 to the host 400. In addition, the host 400 may provide a read request and a read address to the storage device 1000.

The storage device 1000 may read the read data corresponding to the read address provided by the host 400 from the memory device 100 in response to the read request provided from the host 400 and provide the read data to the host 400 as a response to the read request.

Figure 2:
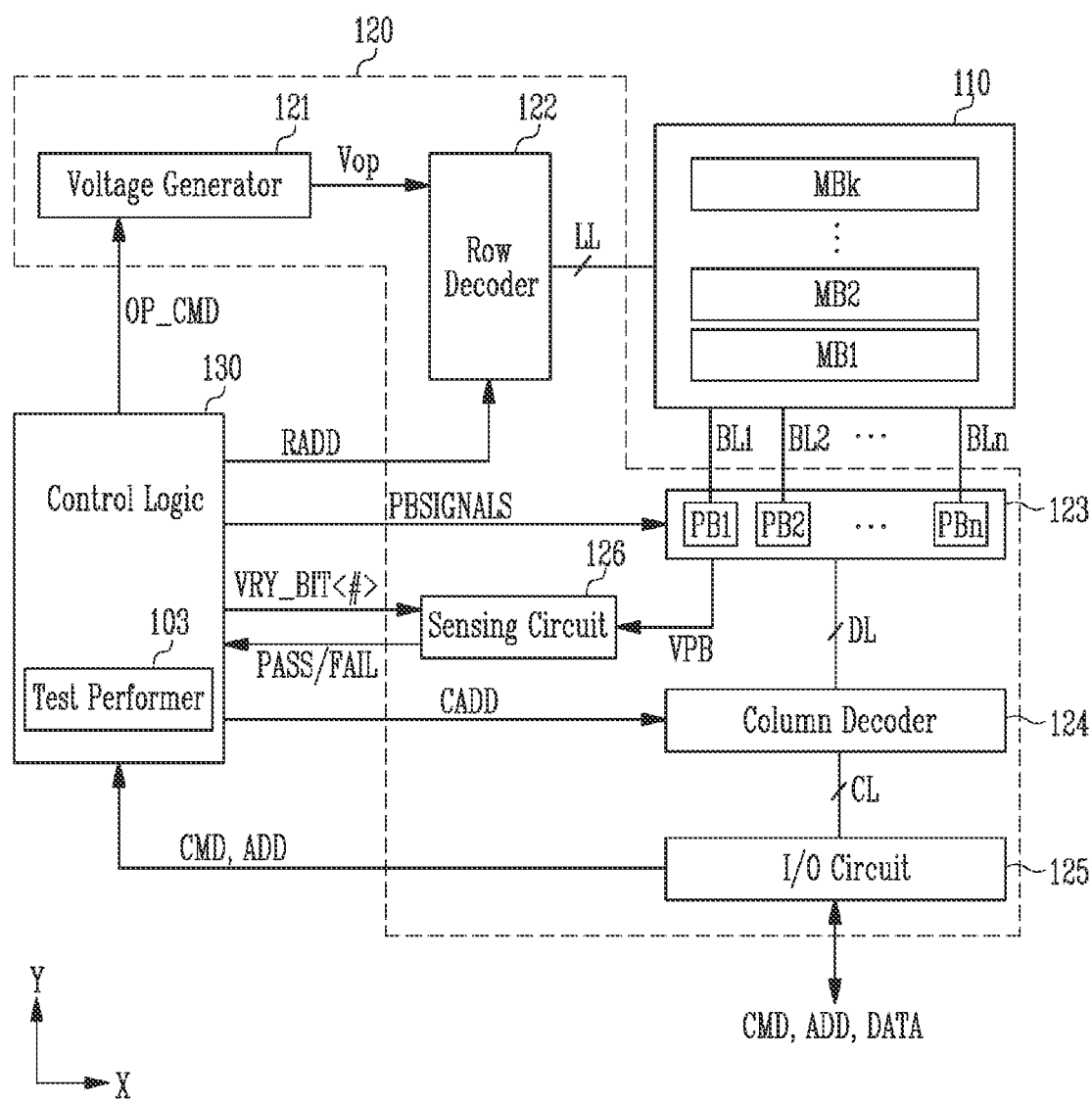
FIG. 2 is a diagram illustrating a memory device according to an embodiment of the present disclosure.

FIG. 2 is a diagram illustrating a memory device according to an embodiment of the present disclosure.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 shown in FIG. 2 maybe the memory cell array 101 shown in FIG. 1.

The memory cell array 110 shown in FIG. 2 may include a plurality of memory blocks MB1 to MBk (k is a positive integer). Here, the number of the plurality of memory blocks MB1 to MBk is only an example for describing embodiments of the present disclosure, but is not limited thereto.

Each of the memory blocks MB1 to MBk may be connected to local lines LL and bit lines BL1 to BLn (n is a positive integer).

The local lines LL may be connected to a row decoder 122.

The local lines LL may be connected to each of the memory blocks MB1 to MBk.

Although not shown, the local lines LL may include a first select line, a second select line, and a plurality of word lines arranged between the first select line and the second select lines.

Although not shown, the local lines LL may further include dummy lines arranged between the first select line and the word lines, dummy lines arranged between the second select line and the word lines, and pipelines.

The bit lines BL1 to BLn may be commonly connected to the memory blocks MB1 to MBk.

The memory blocks MB1 to MBk may be implemented as a two-dimensional or three-dimensional structure.

For example, in the memory blocks MB1 to MBk of the two-dimensional structure, memory cells may be arranged in a direction parallel to a substrate.

For example, in the memory blocks MB1 to MBk of the three-dimensional structure, memory cells may be stacked on a substrate in a vertical direction.

The peripheral circuit 120 may include a voltage generator 121, the row decoder 122, a page buffer group 123, a column decoder 124, an input/output circuit (I/O circuit) 125, and a sensing circuit 126.

The voltage generator 121 may generate various operation voltages Vop used for the program operation, the read operation, and the erase operation in response to an operation command OP_CMD. In addition, the voltage generator 121 may selectively discharge the local lines LL in response to the operation command OP_CMD. For example, the voltage generator 121 may generate a program voltage, a verify voltage, pass voltages, a turn-on voltage, a read voltage, an erase voltage, a source line voltage, and the like under control of the control logic 130.

As an embodiment, the voltage generator 121 may regulate an external power voltage to generate an internal power voltage. The internal power voltage generated by the voltage generator 121 is used as an operation voltage of the memory device 100.

As an embodiment, the voltage generator 121 may generate a plurality of voltages using an external power voltage or an internal power voltage. For example, the voltage generator 121 may include a plurality of pumping capacitors that receive the internal power voltage, and may generate the plurality of voltages by selectively activating the plurality of pumping capacitors in response to the control of the control logic 130. The plurality of generated voltages may be supplied to the memory cell array 110 by the row decoder 122.

As an embodiment, the voltage generator 121 may generate the first test voltage using the external power voltage in response to the control of the control logic 130.

As an embodiment, the level of the first test voltage may be higher than a voltage level of the internal power voltage.

As an embodiment, the voltage generator 121 may generate the second test voltage using the external power voltage or the internal power voltage. For example, the voltage generator 121 may generate a test voltage based on the internal power voltage in response to the control of the control logic 130.

As an embodiment, the level of the second test voltage may be lower than the level of the first test voltage. For example, the level of the second test voltage may be ground. However, the present disclosure is not limited thereto.

Although not shown, the first test voltage or the second test voltage generated by the voltage generator 121 may be supplied to the page buffer group 123.

The row decoder 122 may transfer the operation voltages Vop to the local lines LL in response to a row address RADD. The operation voltages Vop may be transferred to selected memory blocks MB1 to MBk through the local lines LL.

For example, during the program operation, the row decoder 122 may apply the program voltage to a selected word line and a program pass voltage of a level less than that of the program voltage to unselected word lines. During the program verify operation, the row decoder 122 may apply the verify voltage to the selected word line and a verify pass voltage greater than the verify voltage to the unselected word lines.

During the read operation, the row decoder 122 may apply the read voltage to the selected word line, and apply a read pass voltage greater than the read voltage to the unselected word lines.

During the erase operation, the row decoder 122 may select one memory block according to a decoded address. During the erase operation, the row decoder 122 may apply a ground voltage to word lines connected to the selected memory block.

The page buffer group 123 may include first to n-th page buffers PB1 to PBn. The first to n-th page buffers PB1 to PBn may be connected to the memory cell array 110 through the first to n-th bit lines BL1 to BLn, respectively. The first to n-th page buffers PB1 to PBn may operate in response to the control of the control logic 130.

For example, the first to n-th page buffers PB1 to PBn may operate in response to page buffer control signals PBSIGNALS, For example, the first to n-th page buffers PB1 to PBn may temporarily store data received through the first to n-th bit lines BL1 to BLn, or may sense a voltage or a current of the bit lines BL1 to BLn during the read operation or the verify operation.

During the program operation, when the program voltage is applied to the selected word line, the first to n-th page buffers PB1 to PBn may temporarily store data DATA received through the column decoder 124 and the input/output circuit 125 and transfer the data DATA to the selected memory cells through the first to n-th bit lines BL1 to BLn. The memory cells of the selected page are programmed according to the transferred data DATA. The memory cell connected to the bit line to which a program permission voltage (for example, a ground voltage) is applied may have an increased threshold voltage. The threshold voltage of the memory cell connected to the bit line to which a program inhibit voltage (for example, a power voltage) is applied may be maintained.

During the verify operation, the first to n-th page buffers PB1 to PBn may sense the data stored in the selected memory cells through the first to n-th bit lines BL1 to BLn, and may temporarily store the data stored in the selected memory cells.

During the read operation, the first to n-th page buffers PB1 to PBn may sense the data DATA from the memory cells of the selected page through the first to n-th bit lines BL1 to BLn, temporarily store the sensed data DATA, and output the temporarily stored data DATA to the input/output circuit 125 under control of the column decoder 124.

During the erase operation, the first to n-th page buffers PB1 to PBn may float the first to n-th bit lines BL1 to BLn.

As an embodiment, the first to n-th page buffers PB1 to PBn may sequentially transfer the first test voltage and the second test voltage output from the voltage generator 121 to the sensing node.

For example, the first to n-th page buffers PB1 to PBn may transfer the first test voltage to the sensing node during a first period, and transfer the second test voltage to the sensing node during a second period after the first period.

As another example, the first to n-th page buffers PB1 to PBn may transfer the second test voltage to the sensing node during the first period, and transfer the first test voltage to the sensing node during the second period after the first period.

The column decoder 124 may transfer data between the input/output circuit 125 and the page buffer group 123 in response to a column address CADD. For example, the column decoder 124 may exchange data with the page buffers PB1 to PBn through data lines DL, or may exchange data with the input/output circuit 125 through column lines CL.

The input/output circuit 125 may transfer the command CMD and the address ADD received from the memory controller 200 to the control logic 130, or may exchange data DATA with the column decoder 124.

Referring to FIGS. 1 and 2, in an embodiment, the input/output circuit 125 may transfer the test command TCMD output from the memory controller 200 to the control logic 130.

During the read operation or the verify operation, the sensing circuit 126 may generate a reference current in response to a permission bit VRY_BIT<#> signal and compare a sensing voltage VPB received from the page buffer group 123 with a reference voltage generated by the reference current to output a pass signal PASS or a fail signal FAIL.

The control logic 130 may output the operation command OP_CMD, the row address RADD, the page buffer control signals PBSIGNALS, and the permission bit VRY_BIT<#> in response to the command CMD and the address ADD to control the peripheral circuit 120.

As an embodiment, the control logic 130 may include the test performer 103 shown in FIG. 1.

Referring to FIGS. 1 and 2, as an embodiment, in response to the test command TCMD input from the external controller (for example, the memory controller 200), the test performer 103 may control the voltage generator 121 to generate the first test voltage and the second test voltage. In addition, in response to the test command TCMD, the test performer 103 may control the page buffer to sequentially apply the first test voltage and the second test voltage to the sensing node of the page buffer (for example, any one of the first to n-th page buffers PB1 to PBn) through the bit line (for example, any one of the first to n-th bit lines BL1 to BLn). In addition, the test performer 103 may detect the defect of the sensing node of the page buffer according to whether the potential level of the sensing node of the page buffer is changed.

In an embodiment, each of the page buffer control signals PBSIGNALS for controlling the page buffer by the test performer 103 may include a bit line bias signal, a bit line select signal, a bit line discharge signal, a sensing node sensing signal, a page buffer sensing signal, a first control signal, a second control signal, a reset signal, a first set signal, a second set signal, and the like as described later with reference to FIG. 4.

Figure 3:
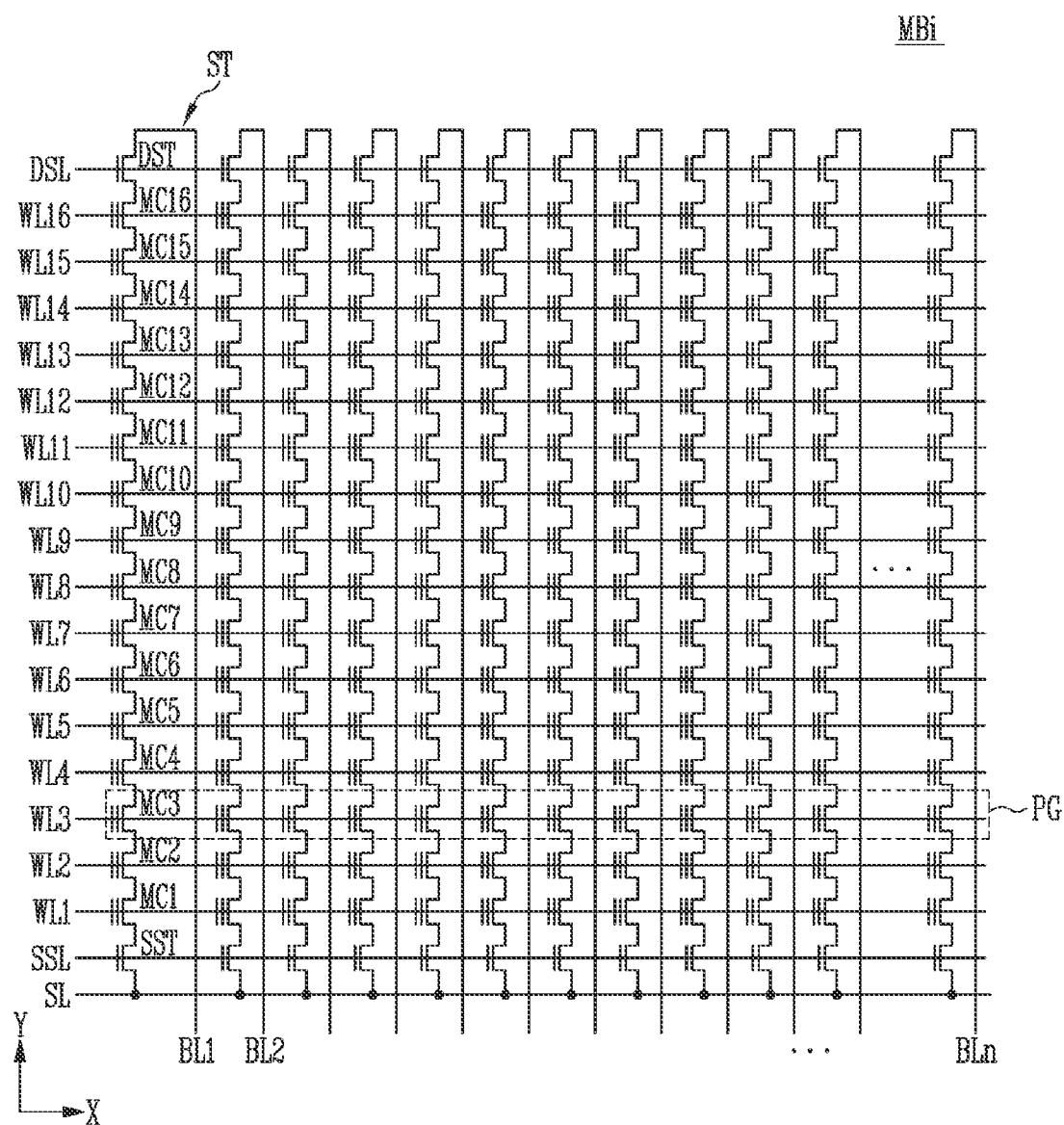
FIG. 3 is a diagram illustrating a structure of any one of a plurality of memory blocks shown in FIG. 2.

FIG. 3 is a diagram illustrating a structure of any one of the plurality of memory blocks shown in FIG. 2.

Referring to FIG. 3, the memory block MBi shown in FIG. 3 may be any one of the memory blocks MB1 to MBk of FIG. 2.

The memory block MBi may include a first select line, a second select line, a plurality of word lines WL1 to WL16, a source line SL, a plurality of bit lines BL1 to BLn, and a plurality of strings ST.

The first select line may be, for example, a source select line SSL. Hereinafter, it is assumed that the first select line is the source select line SSL.

The second select line may be, for example, a drain select line DSL. Hereinafter, it is assumed that the second select line is the drain select line DSL.

The plurality of word lines WL1 to WL16 may be arranged in parallel between the source select line SSL and the drain select line DSL.

The number of word lines WL1 to WL16 shown in FIG. 3 is an example, and is not limited to that shown in the drawing.

The source line SL may be commonly connected to the plurality of strings ST.

The plurality of bit lines BL1 to BLn may be connected to the strings ST, respectively.

The plurality of strings ST may be connected to the bit lines BL1 to BLn and the source line SL.

Since the strings ST may be configured to be identical to each other, the string ST connected to the first bit line BL1 is described as an example.

The string ST may include a plurality of memory cells MC1 to MC16, at least one first select transistor, and at least one second select transistor.

The plurality of memory cells MC1 to MC16 may be connected in series between a source select transistor SST and a drain select transistor DST.

Gates of the memory cells MC1 to MC16 may be connected to the plurality of word lines WL1 to WL16, respectively. Therefore, the number of memory cells MC1 to MC16 included in one string ST may be the same as the number of word lines WL1 to WL16.

Any one of the plurality of memory cells MC1 to MC16 may be configured of any one of the SLC, the MLC, the TLC, and the CLC.

A group of memory cells connected to the same word line among memory cells included in different strings ST may be referred to as a physical page PG. Therefore, the memory block MBi may include the physical pages PG corresponding to the number of word lines WL1 to WL16. Hereinafter, it is assumed that memory cells (for example, MC3) included in the physical page PG are selected memory cells.

The first select transistor may be, for example, a source select transistor SST, Hereinafter, it is assumed that the first select transistor is the source select transistor SST.

A first electrode of the source select transistor SST may be connected to the source line SL. A second electrode of the source select transistor SST may be connected to the first memory cell MC1 among the plurality of memory cells MC1 to MC16. A gate electrode of the source select transistor SST may be connected to the source select line SSL.

The second select transistor may be, for example, a drain select transistor DST, Hereinafter, it is assumed that the second select transistor is the drain select transistor DST.

A first electrode of the drain select transistor DST may be connected to the sixteenth memory cell MC16 among the plurality of memory cells MC1 to MC16. A second electrode of the drain select transistor DST may be connected to the first bit line BL1. A gate electrode of the drain select transistor DST may be connected to the drain select line DSL.

Figure 4:
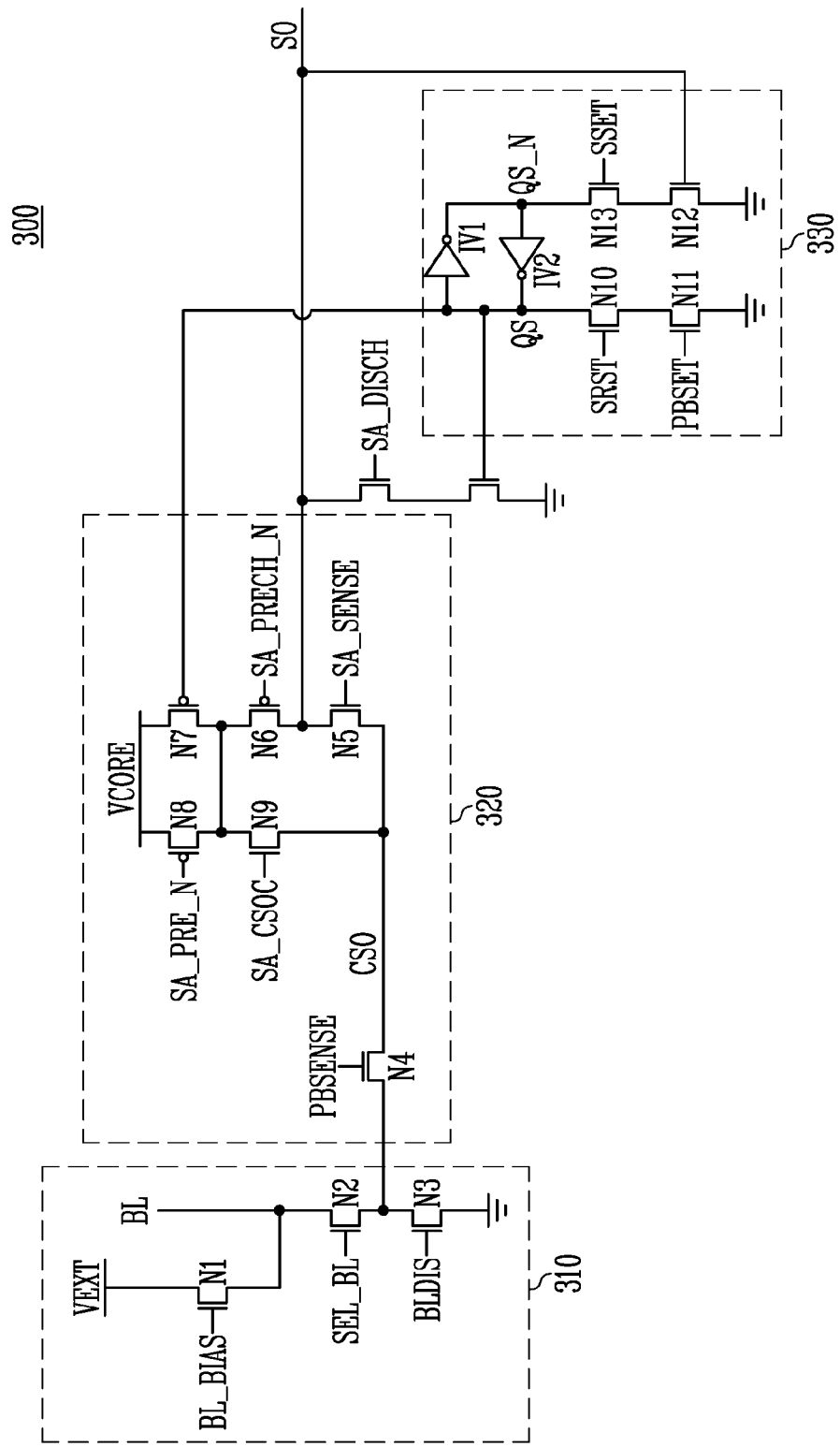
FIG. 4 is a diagram illustrating a page buffer according to an embodiment of the present disclosure.

FIG. 4 is a diagram illustrating a page buffer according to an embodiment of the present disclosure.

Referring to FIG. 4, the page buffer 300 may be the page buffer 102 shown in FIG. 1 or any one of the first to n-th page buffers PB1 to PBn shown in FIG. 2.

The page buffer 300 shown in FIG. 4 may include a test voltage transfer component 310, a sensing node connector 320, and a sensing latch 330.

The test voltage transfer component 310 may transfer a first test voltage VEXT or a second test voltage to a sensing node SO.

Here, a level of the second test voltage may be lower than a level of the first test voltage VEXT. For example, the second test voltage may be ground. However, the present disclosure is not limited thereto. Hereinafter, for convenience of description, it is assumed that the second test voltage is ground.

For example, the test performer 103 provides a bit line select signal SEL_BL to the test voltage transfer component 310. Here, the bit line select signal SEL_BL may be a signal that electrically connects the page buffer 300 to be tested among the plurality of page buffers and a bit line BL.

The test performer 103 may sequentially provide a bit line bias signal BL_BIAS and a bit line discharge signal BLDIS to the test voltage transfer component 310. Here, the bit line bias signal BL_BIAS may be a signal instructing to apply the first test voltage VEXT to the sensing node SO, and the bit line discharge signal BLDIS may be a signal instructing to apply the second test voltage to the sensing node SO.

The test voltage transfer component 310 may provide the first test voltage VEXT to the bit line BL in response to the bit line bias signal BL_BIAS. The test voltage transfer component 310 may provide the second test voltage to the bit line BL in response to the bit line discharge signal BLDIS.

In an embodiment, the test voltage transfer component 310 may include first to third transistors N1 to N3.

The first transistor N1 may be turned on in response to the bit line bias signal BL_BIAS. The bit line bias signal BL_BIAS may be applied to a gate electrode of the first transistor N1, the first test voltage VEXT may be applied to a first electrode of the first transistor N1, and a second electrode of the first transistor N1 may be connected to the bit line BL. The first transistor N1 may be referred to as a bias transistor.

The second transistor N2 may be turned on in response to the bit line select signal SEL_BL. The bit line select signal SEL_BL may be applied to a gate electrode of the second transistor N2, a first electrode of the second transistor N2 may be connected to the bit line BL, and a second electrode of the second transistor N2 may be connected to a first electrode of the third transistor N3.

The third transistor N3 may be turned on in response to the bit line discharge signal BLDIS. The bit line discharge signal BLDIS may be applied to a gate electrode of the third transistor N3, the first electrode of the third transistor N3 may be connected to the second electrode of the second transistor N2, and the second test voltage may be applied to the second electrode of the third transistor N3. In an embodiment, the second electrode of the third transistor N3 may be connected to the ground. The third transistor N3 may be referred to as a discharge transistor.

Although not shown, a signal line through which the bit line bias signal BL_BIAS flows and a signal line through which the bit line discharge signal BLDIS flows may be disposed on different layers. Since the signal line through which the bit line bias signal BL_BIAS flows and the signal line through which the bit line discharge signal BLDIS flows are stacked on different layers, it may be checked whether the sensing node is defective by changing a potential of the sensing node SO without providing data to the page buffer 300.

In an embodiment, the test performer 103 may provide a connection signal instructing to connect the bit line BL and the sensing node SO to the sensing node connector 320. Here, the connection signal may include, for example, a page buffer sensing signal PBSENSE and a sensing node sensing signal SA_SENSE.

The sensing node connector 320 may electrically connect the bit line BL and the sensing node SO. For example, the sensing node connector 320 may electrically connect the bit line BL, a common sensing node CSO, and the sensing node SO in response to the page buffer sensing signal PBSENSE and the sensing node sensing signal SA_SENSE.

The sensing node connector 320 may include fourth to ninth transistors N4 to N9.

The fourth transistor N4 may be turned on in response to the page buffer sensing signal PBSENSE. The page buffer sensing signal PBSENSE may be applied to a gate electrode of the fourth transistor N4, a first electrode of the fourth transistor N4 may be connected to the test voltage transfer component 310, and a second electrode of the fourth transistor N4 may be connected to the common sensing node CSO.

As an embodiment, the first electrode of the fourth transistor N4 may be connected to a node to which the second electrode of the second transistor N2 and the first electrode of the third transistor N3 are electrically connected.

The fifth transistor N5 may be turned on in response to the sensing node sensing signal SA_SENSE. The sensing node sensing signal SA_SENSE may be applied to a gate electrode of the fifth transistor N5, a first electrode of the fifth transistor N5 may be connected to the sensing node SO, and a second electrode of the fifth transistor N5 may be connected to the common sensing node CSO.

The sixth transistor N6 may be turned on in response to a sensing node precharge signal SA_PRECH_N. The sensing node precharge signal SA_PRECH_N may be applied to a gate electrode of the sixth transistor N6, a first electrode of the sixth transistor N6 may be connected to the common sensing node CSO, and the second electrode of the sixth transistor N6 may be connected to a first electrode of the seventh transistor N7, a second electrode of the eighth transistor N8, and a first electrode of the ninth transistor N9.

The seventh transistor N7 may be turned on according to a potential level of a first latch node QS of the sensing latch 330. A gate electrode of the seventh transistor N7 may be connected to the first latch node QS, the first electrode of the seventh transistor N7 may be connected to the second electrode of the sixth transistor N6 and the second electrode of the eighth transistor N8, and a core voltage VCORE may be applied to a second electrode of the seventh transistor N7. The core voltage VCORE may be the internal power voltage described above with reference to FIG. 2.

The eighth transistor N8 may be turned on in response to a first control signal SA_PRE_N. The first control signal SA_PRE_N may be input to a gate electrode of the eighth transistor N8, the core voltage VCORE may be applied to a first electrode of the eighth transistor N8, and the second electrode of the eighth transistor N8 may be connected to the second electrode of the sixth transistor N6, the first electrode of the seventh transistor N7, and the first electrode of the ninth transistor N9.

The ninth transistor N9 may be turned on in response to a second control signal SA_CSOC. The second control signal SA_CSOC may be input to a gate electrode of the ninth transistor N9, the first electrode of the ninth transistor N9 may be connected to the second electrode of the sixth transistor N6, the first electrode of the seventh transistor N7, and the second electrode of the eighth transistor N8, and a second electrode of the ninth transistor N9 may be connected to the common sensing node CSO.

The sensing latch 330 may latch a sensing value corresponding to the potential level of the sensing node SO and provide the sensing value to the test performer 103.

The sensing latch may include inverters IV1 and IV2 and tenth to thirteenth transistors N10 to N13.

The inverters IV1 and IV2 may be connected in reverse parallel between the first latch node QS and a second latch node QS_N.

The tenth transistor N10 and the eleventh transistor N11 may be connected in series between the first latch node QS and the ground. The tenth transistor N10 may be turned on in response to a reset signal SRST, and the eleventh transistor N11 may be turned on in response to a first set signal PBSET. When the tenth transistor N10 and the eleventh transistor N11 are turned on, the first latch node QS and the ground may be electrically connected.

For example, in a state in which the sensing node SO is precharged to a first level (for example, a high level), when the reset signal SRST is input to the tenth transistor N10 and the first set signal PBSET is input to the eleventh transistor N11, the first latch node QS may be initialized to a second level (for example, a low level) lower than the first level, and the second latch node QS_N may be initialized to the first level.

The twelfth transistor N12 and the thirteenth transistor N13 may be connected in series between the second latch node QS_N and the ground. The twelfth transistor N12 may be turned on according to the potential level of the sensing node SO, and the thirteenth transistor N13 may be turned on in response to a second set signal SSET. When the twelfth transistor N12 and the thirteenth transistor N13 are turned on, the second latch node QS_N and the ground may be electrically connected.

For example, in a state in which the sensing node SO is precharged to the first level (for example, the high level), when the second set signal SSET is applied to the thirteenth transistor N13, the first latch node QS may be set to the first level, and the second latch node QS_N may be set to the second level (for example, the low level) lower than the first level.

An input of the above-described control signals BL_BIAS, SEL_BL, BLDIS, PBSENSE, SA_CSOC, SA_PRE_N, SA_PRECH_N, SA_SENSE, SA_DISCH, SRST, PBSET, and SSET to the transistors N1 to N13 may mean an input of the control signals of a turn-on level to the transistors N1 to N13 according to a preset timing. The word "preset" as used herein with respect to a parameter, such as a preset timing and preset reference level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

That the above-described control signals BL_BIAS, SEL_BL, BLDIS, PBSENSE, SA_CSOC, SA_PRE_N, SA_PRECH_N, SA_SENSE, SA_DISCH, SRST, PBSET, and SSET are not input to the transistors N1 to N13 may mean an input of the control signals of a turn-off level to the transistors N1 to N13 according to a preset timing.

Figure 5:
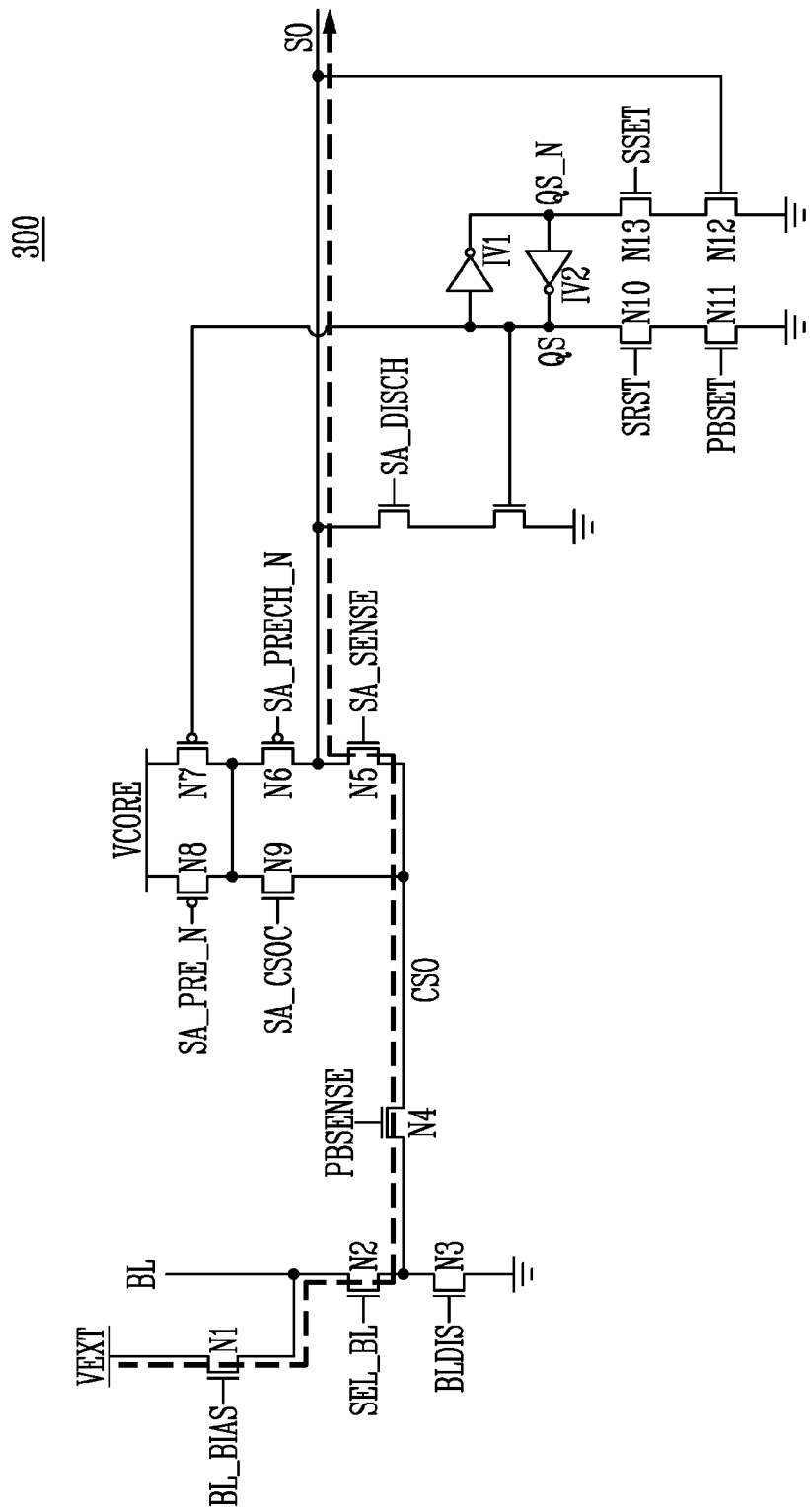
FIG. 5 is a diagram illustrating an embodiment of applying a first test voltage to a sensing node of the page buffer shown in FIG. 4.
Figure 6:
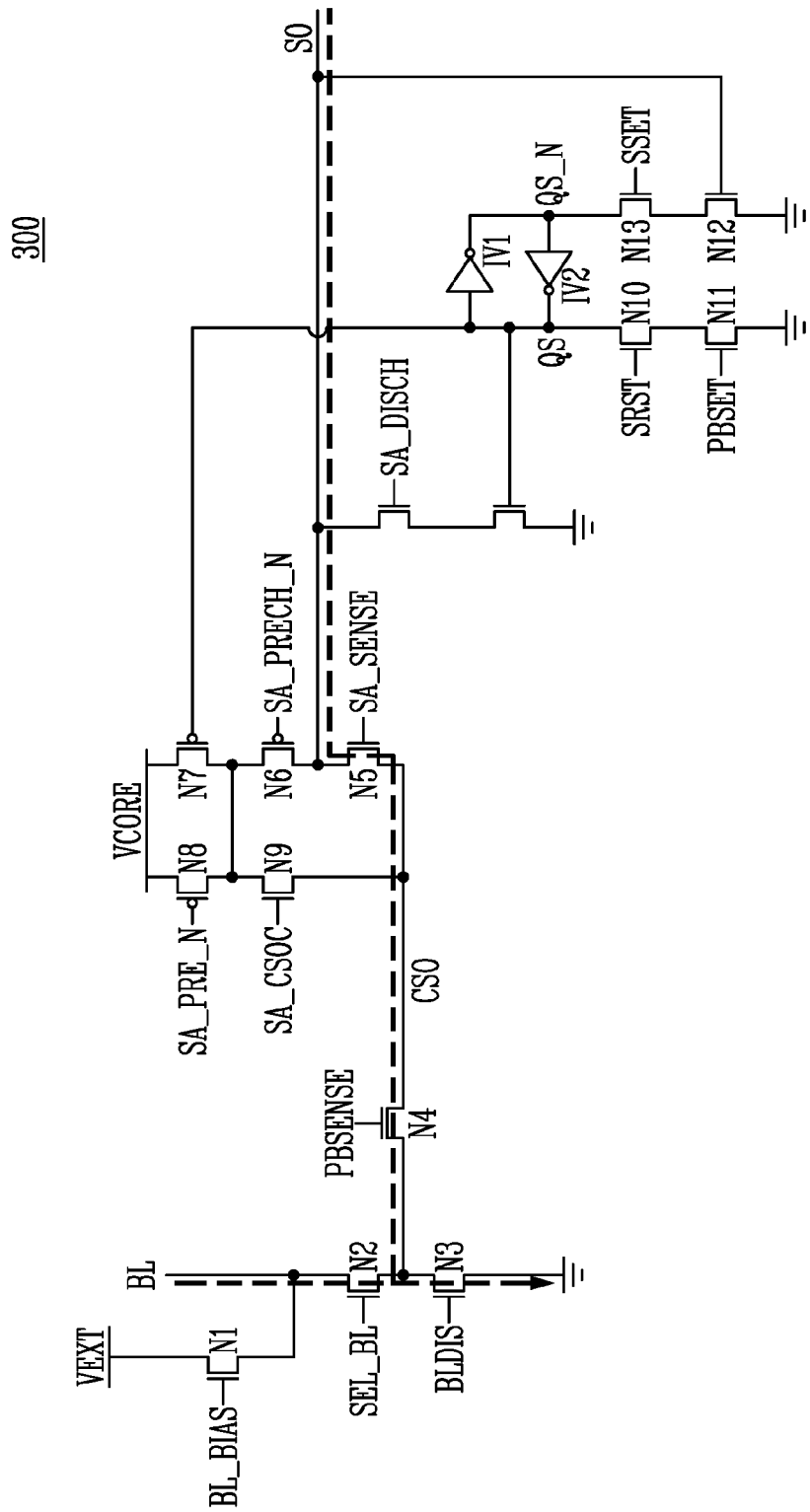
FIG. 6 is a diagram illustrating an embodiment of applying a second test voltage to the sensing node of the page buffer shown in FIG. 4.
Figure 7:
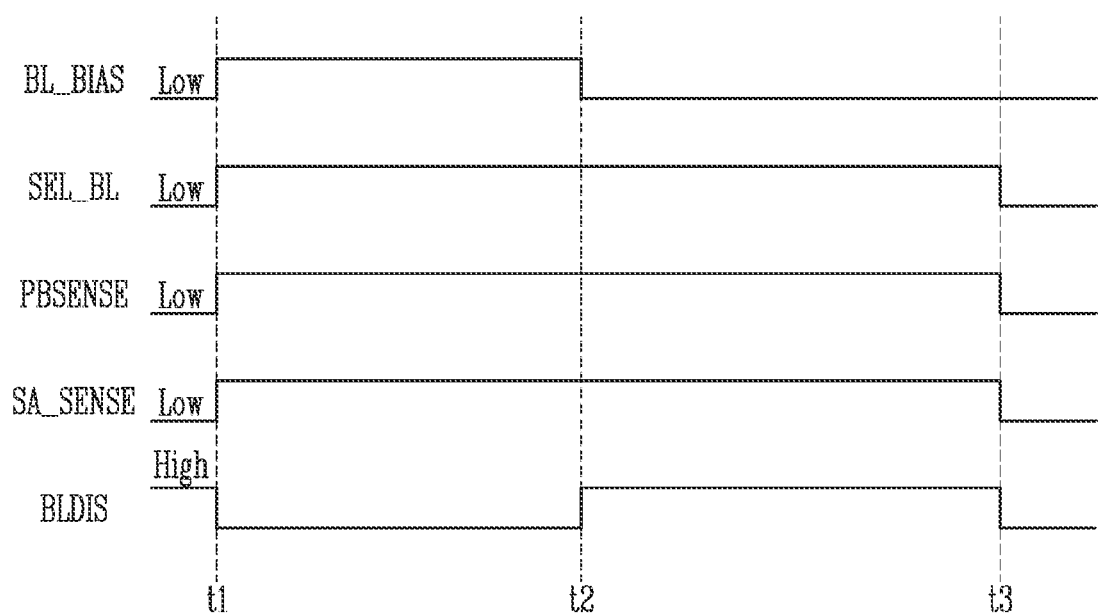
FIG. 7 is a diagram schematically illustrating signal waveforms of control signals for applying a first test voltage and a second test voltage to a sensing node.

FIG. 5 is a diagram illustrating an embodiment of applying a first test voltage to the sensing node of the page buffer shown in FIG. 4, FIG. 6 is a diagram illustrating an embodiment of applying a second test voltage to the sensing node of the page buffer shown in FIG. 4, and FIG. 7 is a diagram schematically illustrating signal waveforms of control signals for applying a first test voltage and a second test voltage to a sensing node.

Referring to FIGS. 1, 2, and 5, the test performer 103 may input the bit line bias signal BL_BIAS, the bit line select signal SEL_BL, the page buffer sensing signal PBSENSE, and the sensing node sensing signal SA_SENSE to the first transistor N1, the second transistor N2, the fourth transistor N4, and the fifth transistor N5 so that the first test voltage VEXT is applied to the sensing node SO. Accordingly, the first transistor N1, the second transistor N2, the fourth transistor N4, and the fifth transistor N5 may be turned on, and the third transistor N3 and the sixth to ninth transistors N6 to N9 may be turned off. In this case, a first path to which the first transistor N1, the bit line BL, the second transistor N2, the fourth transistor N4, the common sensing node CSO, and the fifth transistor N5 are electrically connected may be formed, and the first test voltage may be applied to the sensing node SO through the first path (i.e., the dotted line shown in FIG. 5).

In an embodiment, the potential level of the sensing node SO may be changed from the second level (for example, the low level) to the first level (for example, the high level) in response to a turn-on of the bias transistor, for example, the first transistor N1 and a turn-off of the discharge transistor, for example, the third transistor N3.

Referring to FIG. 7, at a first time point t1, the bit line bias signal BL_BIAS, the bit line select signal SEL_BL, the page buffer sensing signal PBSENSE, and the sensing node sensing signal SA_SENSE may be changed from a second level (for example, a low level Low) to a first level (for example, a high level High). At the first time point t1, the bit line discharge signal BLDIS may be changed from the first level to the second level.

During a first period corresponding to a period from the first time point t1 to a second time point t2, the bit line bias signal BL_BIAS, the bit line select signal SEL_BL, the page buffer sensing signal PBSENSE, and the sensing node sensing signal SA_SENSE may maintain the first level and the bit line discharge signal BLDIS may maintain the second level. The first test voltage VEXT may be applied to the sensing node SO during the first period.

Referring to FIGS. 1, 2, and 6, the test performer 103 may input the bit line select signal SEL_BL, the bit line discharge signal BLDIS, the page buffer sensing signal PBSENSE, and the sensing node sensing signal SA_SENSE to the second to fifth transistors N2 to N5 so that the second test voltage (for example, ground) is applied to the sensing node SO. Accordingly, the second to fifth transistors N2 to N5 may be turned on, and the first transistor N1 and the sixth to ninth transistors N6 to N9 may be turned off. In this case, a second path to which the bit line BL, the second transistor N2, the third transistor N3, the fourth transistor N4, the common sensing node CSO, and the fifth transistor N5 are electrically connected may be formed, and the second test voltage may be applied to the sensing node SO through the second path.

Referring to FIG. 7, at the second time point t2, the bit line bias signal BL_BIAS nay be changed from the first level (for example, the high level High) to the second level (for example, the low level Low). At the second time point t2, the bit line discharge signal BLDIS may be changed from the second level to the first level. The bit line select signal SEL_BL, the page buffer sensing signal PBSENSE, and the sensing node sensing signal SA_SENSE may be the first level.

During a second period corresponding to a period from the second time point t2 to a third time point t3, the bit line bias signal BL_BIAS may maintain the second level, and the bit line select signal SEL_BL, the page buffer sensing signal PBSENSE, the sensing node sensing signal SA_SENSE, and the bit line discharge signal BLDIS may maintain the first level. The second test voltage may be applied to the sensing node SO during the second period.

In an embodiment, the potential level of the sensing node SO may be changed from the first level (for example, the high level) to the second level (for example, the low level) in response to a turn-off of the bias transistor, for example, the first transistor N1 and a turn-on of the discharge transistor, for example, the third transistor N3.

As shown in FIGS. 1, 2, and 7, the test performer 103 may apply the first test voltage VEXT to the sensing node SO during the first period corresponding from the first time point t1 to the second time point t2 and apply the second test voltage to the node SO during the second period corresponding from the second time point t2 to the third time point t3. However, the present disclosure is not limited thereto.

Although not shown, the test performer 103 may apply the second test voltage to the sensing node SO during the first period corresponding to the period from the first time point t1 to the second time point t2 and apply the first test voltage VEXT to the sensing node SO during the second period corresponding to the period from the second time point t2 to the third time point t3.

Similarly, as shown in FIG. 7, the bit line bias signal BL_BIAS of the first level and the bit line discharge signal BLDIS of the second level may be input to the test voltage transfer component 310 during the first period corresponding to the period from the first time point t1 to the second time point t2, and the bit line bias signal BL_BIAS of the second level and the bit line discharge signal BLDIS of the first level may be input to the test voltage transfer component 310 during the second period corresponding to the period from the second time point t2 to the third time point t3. However, the present disclosure is not limited thereto.

For example, the test performer 103 may provide the bit line discharge signal BLDIS of the first level to the test voltage transfer component 310 after providing the bit line bias signal BL_BIAS of the first level to the test voltage transfer component 310.

Although not shown, the bit line bias signal BL_BIAS of the second level and the bit line discharge signal BLDIS of the first level may be input to the test voltage transfer component 310 during the first period, and the bit line bias signal BL_BIAS of the first level and the bit line discharge signal BLDIS of the second level may be input to the test voltage transfer component 310 during the second period.

For example, the test performer 103 may provide the bit line bias signal BL_BIAS of the first level to the test voltage transfer component 310 after providing the bit line discharge signal BLDIS of the first level to the test voltage transfer component 310.

Figure 8:
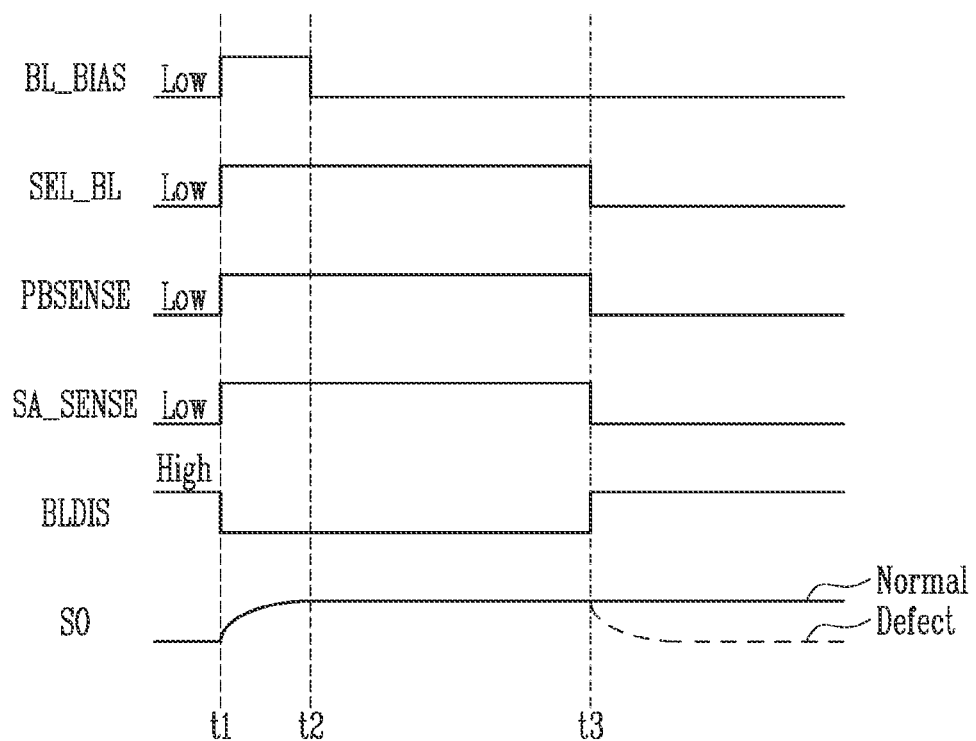
FIG. 8 is a diagram illustrating an embodiment of detecting a defect of the sensing node of the page buffer shown in FIG. 4.

FIG. 8 is a diagram illustrating an embodiment of detecting a defect of the sensing node of the page buffer shown in FIG. 4.

Referring to FIGS. 4 and 8, the test performer 103 may perform a precharge operation of changing the potential level of the sensing node SO from a second level (for example, a low level) to a first level (for example, a high level) after the first test voltage VEXT and the second test voltage are applied to the sensing node SO.

Referring to FIGS. 4 and 8, for example, at a first time point t1, the bit line bias signal BL_BIAS, the bit line select signal SEL_BL, the page buffer sensing signal PBSENSE, and the sensing node sensing signal SA_SENSE may be changed from the second level to the first level. The bit line discharge signal BLDIS may be changed from the first level to the second level. In this case, the potential level of the sensing node SO may be increased by the first test voltage VEXT.

At a second time point t2, the bit line bias signal BL_BIAS may be changed from the first level to the second level. The bit line select signal SEL_BL, the page buffer sensing signal PBSENSE, and the sensing node sensing signal SA_SENSE may maintain the first level. The bit line discharge signal BLDIS may maintain the second level. In addition, the potential level of the sensing node SO may be changed from the second level to the first level. That is, the sensing node SO may be pre-charged to the first level.

During a period from the first time point t1 to a third time point t3, the bit line select signal S EL_BL, the page buffer sensing signal PBSENSE, and the sensing node sensing signal SA_SENSE may maintain the first level, and the bit line discharge signal BLDIS may maintain the second level.

After the sensing node SO is precharged, the test performer 103 may detect the defect of the sensing node SO in response to a change of the potential level of the sensing node SO to be less than a preset reference level from the first level, by using the sensing value of the sensing latch 330.

At the third time point t3, the bit line select signal SEL_BL, the page buffer sensing signal PBSENSE, and the sensing node sensing signal SA_SENSE may be changed from the first level to the second level. The bit line discharge signal BLDIS may be changed from the second level to the first level. Here, when the potential level of the sensing node SO is maintained as the first level, a state of the sensing node SO may be detected as a normal state Normal. When the potential level of the sensing node SO is reduced from the first level and the potential level of the sensing node SO is less than the reference level, the state of the sensing node SO may be detected as a defective state Defect.

Figure 9:
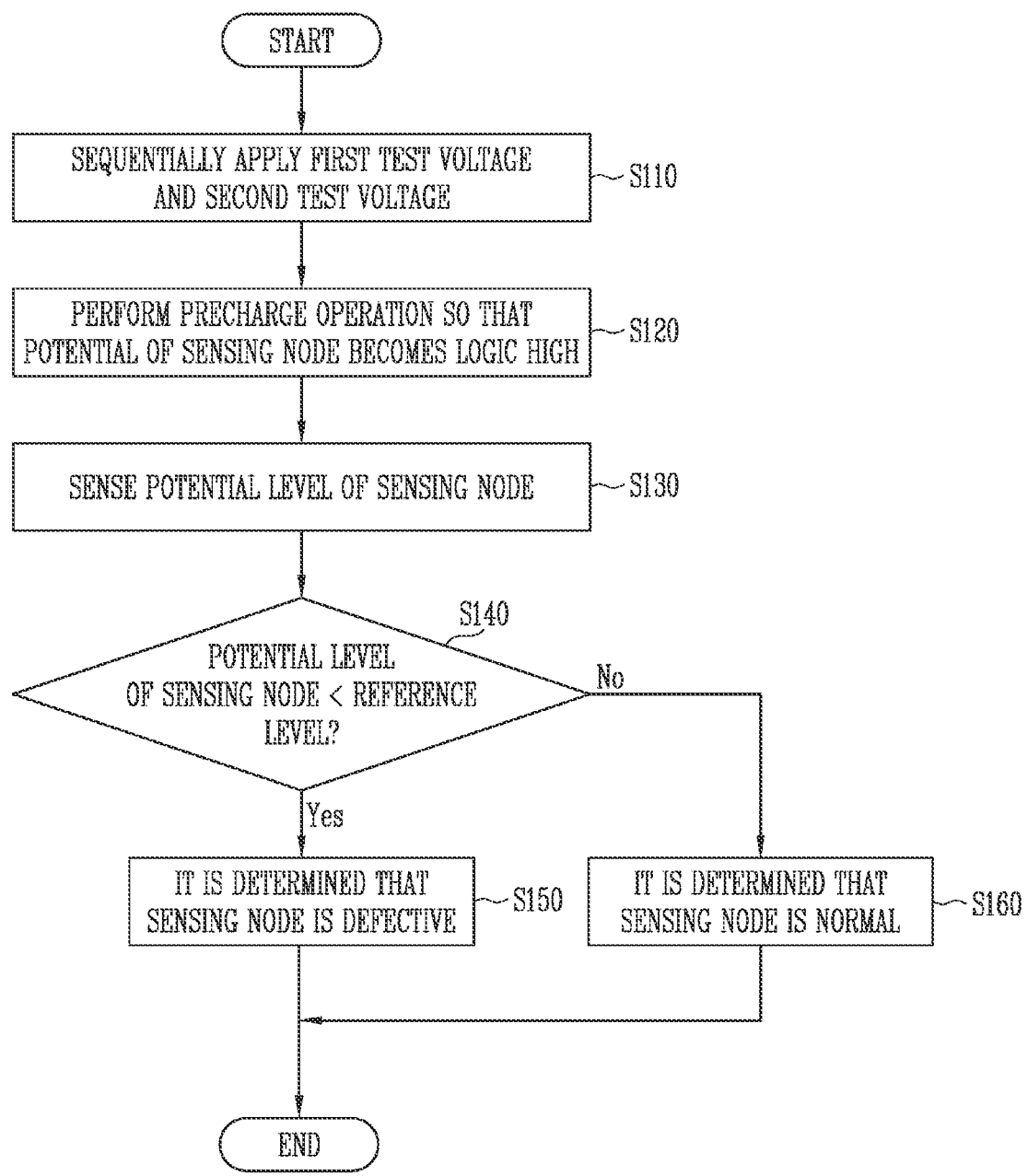
FIG. 9 is a flowchart illustrating a method of operating a memory device according to an embodiment of the present disclosure.

FIG. 9 is a flowchart illustrating a method of operating a memory device according to an embodiment of the present disclosure.

Referring to FIGS. 1 and 9, the memory device 100 sequentially applies the first test voltage and the second test voltage (S110).

For example, the test performer 103 may sequentially apply the first test voltage and the second test voltage to the sensing node of the page buffer 102 through the bit line.

For an example, the test performer 103 may provide the bit line bias signal instructing to apply the first test voltage to the sensing node to the page buffer 102, and may apply the bit line discharge signal instructing to apply the second test voltage to the sensing node to the page buffer 102 after the bit line bias signal is provided.

As another example, the test performer 103 may provide the bit line discharge signal instructing to apply the second test voltage to the sensing node to the page buffer 102, and may apply the bit line bias signal instructing to apply the first test voltage to the sensing node to the page buffer 102 after the bit line discharge signal is provided.

In an embodiment, the potential level of the sensing node may be changed from the second level to the first level as the first test voltage is applied.

In an embodiment, the potential level of the sensing node may be changed to the second level lower than the first level as the second test voltage is applied.

The memory device 100 performs the pre-charge operation so that the potential of the sensing node becomes logic high (S120).

For example, after the first test voltage and the second test voltage are applied to the sensing node, the test performer 103 may perform the pre-charge operation of changing the potential level of the sensing node from the second level to the first level higher than the second level.

The memory device 100 senses the potential level of the sensing node (S130), and determines whether the potential level of the sensing node is less than the preset reference level (S140).

For example, the test performer 103 may change the bit line select signal, the page buffer sensing signal, and the sensing node sensing signal from the first level to the second level at a specific time point, and change the bit line discharge signal from the second level to the first level. In this case, the potential level of the sensing node may be maintained as the first level or reduced from the first level.

When the potential level of the sensing node is less than the reference level (S140, Yes), the memory device 100 determines that the sensing node is defective (S150).

When the potential level of the sensing node is equal to or greater than the reference level (S140, No), the memory device 100 determines that the sensing node is normal (S160).

Figure 10:
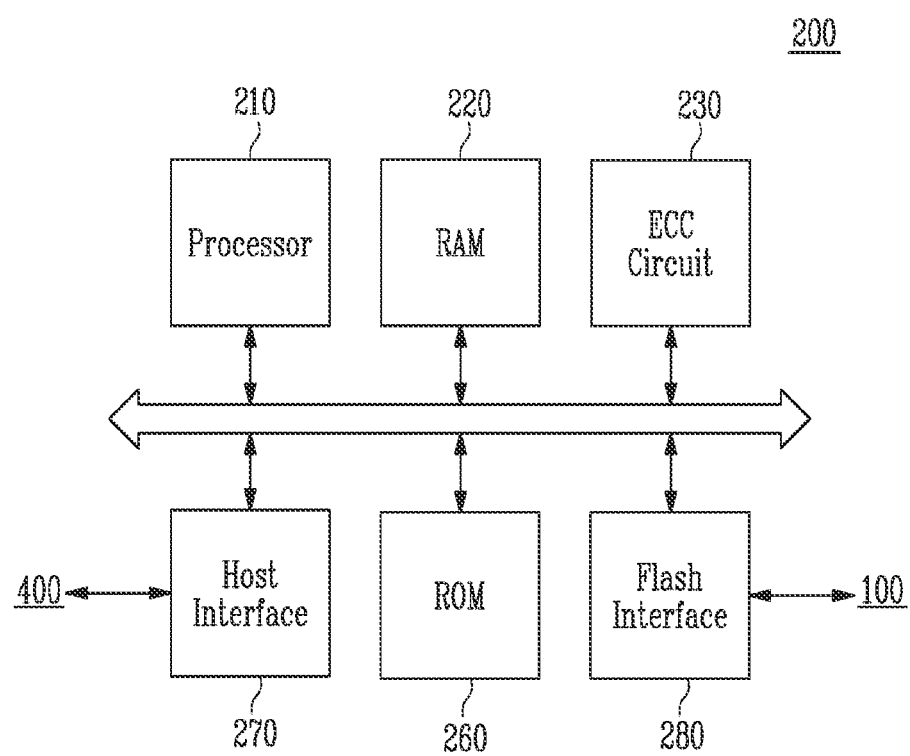
FIG. 10 is a diagram illustrating a memory controller according to an embodiment of the present disclosure.

FIG. 10 is a diagram illustrating a memory controller according to an embodiment of the present disclosure.

Referring to FIGS. 1 and 10, the memory controller 200 may include a processor 210, a RAM 220, an error correction circuit 230, a ROM 260, a host interface 270, and a flash interface 280.

The processor 210 may control an overall operation of the memory controller 200.

The RAM 220 may be used as a buffer memory, a cache memory, an operation memory, and the like of the memory controller 200, For example, the buffer memory may be the RAM 220, and in an embodiment, the buffer memory may be an SRAM.

The ROM 260 may store various information required for the memory controller 200 to operate in a firmware form.

The memory controller 200 may communicate with an external device (for example, the host 400, an application processor, and the like) through the host interface 270.

The memory controller 200 may communicate with the memory device 100 through the flash interface 280. The memory controller 200 may transmit a command CMD, an address ADDR, a control signal CTRL, and the like to the memory device 100 and receive data DATA through the flash interface 280.

For example, the flash interface 280 may include a NAND interface.

Figure 11:
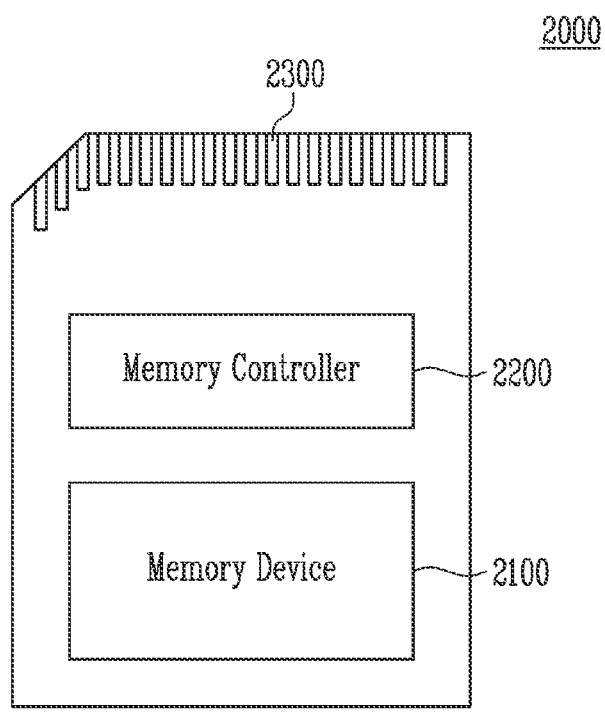
FIG. 11 is a block diagram illustrating a memory card system to which a storage device according to an embodiment of the present disclosure is applied.

FIG. 11 is a block diagram illustrating a memory card system to which a storage device according to an embodiment of the present disclosure is applied.

Referring to FIGS. 1 and 11, the memory card system 2000 includes a memory device 2100, a memory controller 2200, and a connector 2300.

For example, the memory device 2100 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2200 is connected to the memory device 2100. The memory controller 2200 is configured to access the memory device 2100. For example, the memory controller 2200 may be configured to control read, write, erase, and background operations of the memory device 2100. The memory controller 2200 is configured to provide an interface between the memory device 2100 and the host 400. The memory controller 2200 is configured to drive firmware for controlling the memory device 2100. The memory controller 2200 may be implemented equally to the memory controller 200 described with reference to FIG. 1.

For example, the memory controller 2200 may include components such as a random access memory (RAM), a processor, a host interface, a memory interface, and an error correction circuit.

The memory controller 2200 may communicate with an external device through the connector 2300. The memory controller 2200 may communicate with an external device (for example, the host 400) according to a specific communication standard. For example, the memory controller 2200 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

The memory device 2100 and the memory controller 2200 may be integrated into one semiconductor device to configure a memory card. For example, the memory controller 2200 and the memory device 2100 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 12:
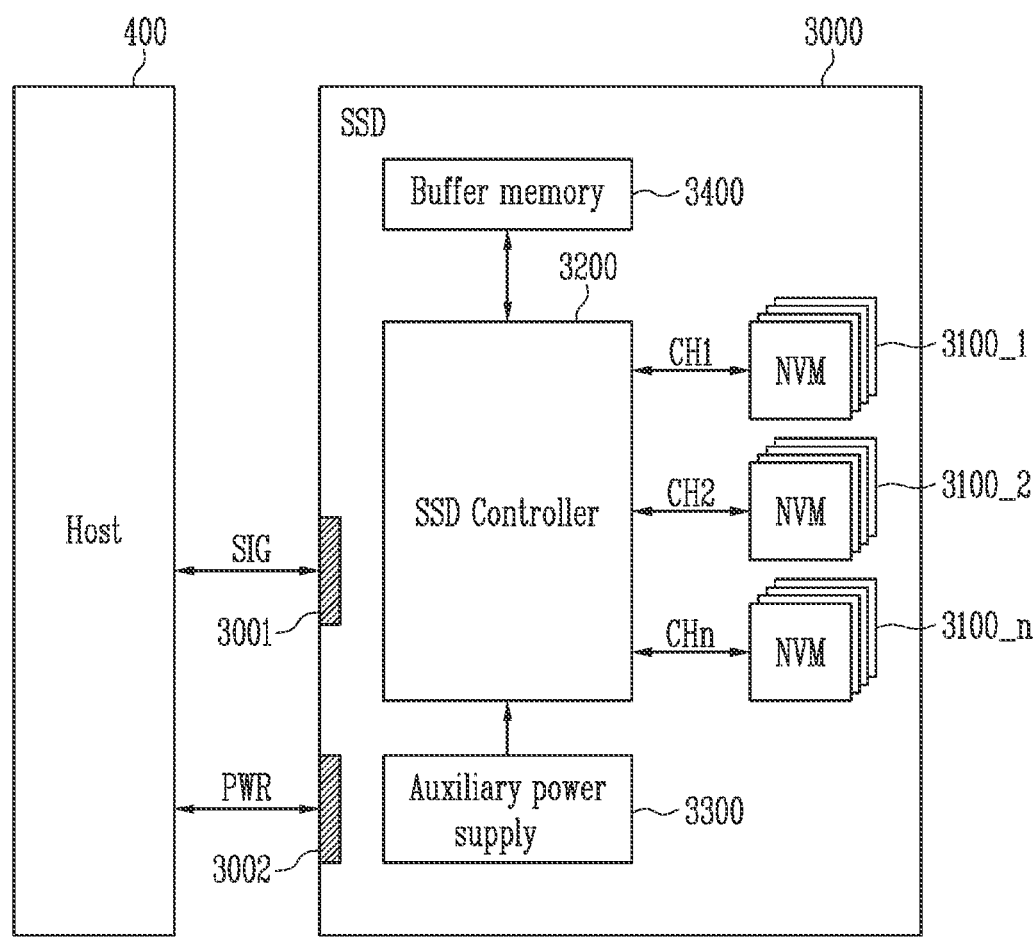
FIG. 12 is a block diagram illustrating a solid state drive (SSD) system to which a storage device according to an embodiment of the present disclosure is applied.

FIG. 12 is a block diagram illustrating a solid state drive (SSD) system to which a storage device according to an embodiment of the present disclosure is applied.

Referring to FIGS. 1 and 12, the SSD system includes the host 400 and an SSD 3000.

The SSD 3000 exchanges a signal SIG with the host 400 through a signal connector 3001 and receives power PWR through a power connector 3002. The SSD 3000 includes an SSD controller 3200, a plurality of flash memories 3100_1, 3100_2, and 3100_n, an auxiliary power device 3300, and a buffer memory 3400.

According to an embodiment of the present disclosure, the SSD controller 3200 may perform the function of the memory controller 200 described with reference to FIG. 1.

The SSD controller 3200 may control the plurality of flash memories 3100_1, 3100_2, and 3100_n in response to the signal SIG received from the host 400. For example, the signal SIG may be signals based on an interface between the host 400 and the SSD 3000. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3300 is connected to the host 400 through the power connector 3002. The auxiliary power device 3300 may receive the power PWR from the host 400 and may charge the power. The auxiliary power device 3300 may provide power of the SSD 3000 when power supply from the host 400 is not smooth. For example, the auxiliary power device 3300 may be positioned in the SSD 3000 or may be positioned outside the SSD 3000. For example, the auxiliary power device 3300 may be positioned on a main board and may provide auxiliary power to the SSD 3000.

The buffer memory 3400 may temporarily store data. For example, the buffer memory 3400 may temporarily store data received from the host 400 or data received from the plurality of flash memories 3100_1, 3100_2, and 3100_n, or may temporarily store meta data (for example, a mapping table) of the flash memories 3100_1, 3100_2, and 3100_n. The buffer memory 3400 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 13:
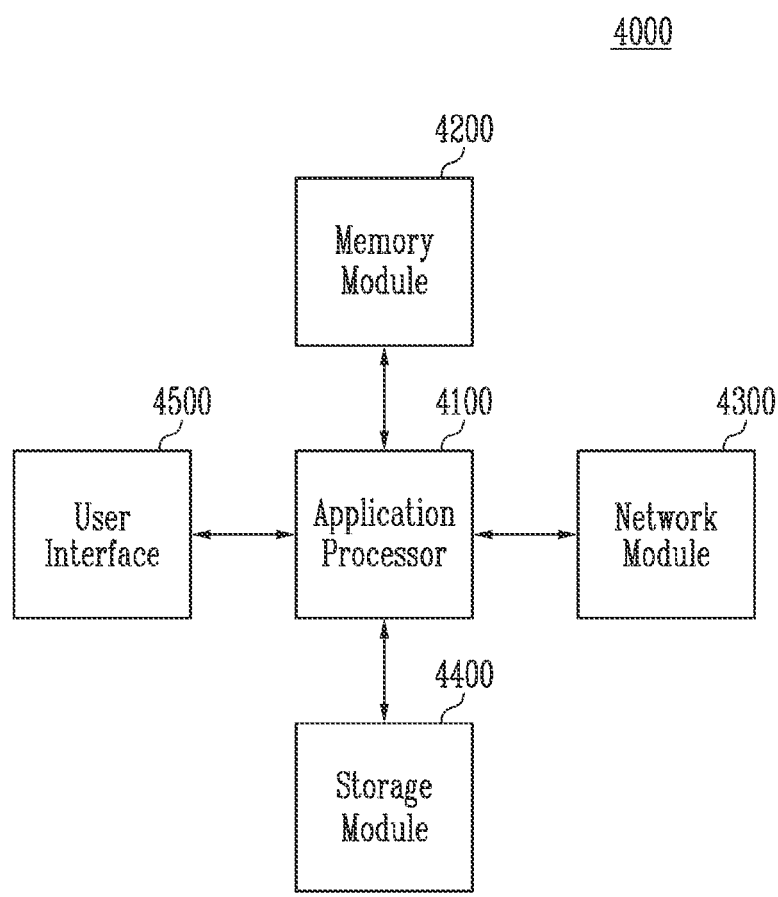
FIG. 13 is a block diagram illustrating a user system to which a storage device according to an embodiment of the present disclosure is applied.

FIG. 13 is a block diagram illustrating a user system to which a storage device according to an embodiment of the present disclosure is applied.

Referring to FIG. 13, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may operate identically to the storage device 1000 described with reference to FIG. 1. The storage module 4400 may include a plurality of nonvolatile memory devices, and the plurality of nonvolatile memory devices may operate identically to the memory device 100 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   a memory cell connected to a bit line;
   a page buffer configured to store data to be stored in the memory cell; and
   a test performer configured to control the page buffer to sequentially apply a first test voltage and a second test voltage of a level lower than a level of the first test voltage to a sensing node of the page buffer through the bit line, and detect a defect of the sensing node according to whether a potential level of the sensing node is changed,
   wherein the page buffer comprises:
      a test voltage transfer component configured to transfer the first test voltage or the second test voltage to the sensing node;
      a sensing node connector configured to electrically connect the bit line and the sensing node; and
      a sensing latch configured to latch a sensing value corresponding to the potential level of the sensing node and provide the sensing value to the test performer, and
   wherein the test performer performs a precharge operation of changing the potential level of the sensing node from a second level to a first level higher than the second level after the first test voltage and the second test voltage are applied to the sensing node, and detects the defect of the sensing node in response to a change of the potential level of the sensing node to be less than a preset reference level from the first level.

2. The memory device of claim 1, wherein the test performer is configured to control the page buffer to sequentially apply the first test voltage and the second test voltage of the level lower than the level of the first test voltage to the sensing node of the page buffer through the bit line, and detect the defect of the sensing node according to whether the potential level of the sensing node is changed, in response to a test command input from an external controller.

3. The memory device of claim 1, wherein the test performer sequentially provides a bit line bias signal to the page buffer to apply the first test voltage to the sensing node and a bit line discharge signal to the page buffer to apply the second test voltage to the sensing node.

4. The memory device of claim 3, wherein the test performer provides the bit line bias signal to the test voltage transfer component and then provides the bit line discharge signal to the test voltage transfer component.

5. The memory device of claim 3, wherein the test performer provides the bit line discharge signal to the test voltage transfer component and then provides the bit line bias signal to the test voltage transfer component.

6. The memory device of claim 3, wherein the test voltage transfer component provides the first test voltage to the bit line in response to the bit line bias signal, and provides the second test voltage to the bit line in response to the bit line discharge signal.

7. The memory device of claim 6, wherein the test voltage transfer component comprises:
a bias transistor turned on in response to the bit line bias signal; and
a discharge transistor turned on in response to the bit line discharge signal.

8. The memory device of claim 7, wherein the potential level of the sensing node is changed to the first level in response to a turn-on of the bias transistor and a turn-off of the discharge transistor, and is changed to the second level lower than the first level in response to a turn-off of the bias transistor and a turn-on of the discharge transistor.

9. The memory device of claim 1, wherein the test performer provides a connection signal to connect the bit line and the sensing node to the sensing node connector.

10. A method of operating a memory device, the method comprising:

sequentially applying a first test voltage and a second test voltage of a level lower than a level of the first test voltage to a sensing node of a page buffer through a bit line; and detecting a defect of the sensing node according to whether a potential level of the sensing node is changed to be less than a preset reference level, wherein detecting the defect of the sensing node comprises:

performing a precharge operation of changing the potential level of the sensing node from a second level to a first level higher than the second level after the first test voltage and the second test voltage are applied to the sensing node; and detecting the defect of the sensing node in response to a change of the potential level of the sensing node to be less than the preset reference level from the first level.

11. The method of claim 10, wherein applying the first test voltage and the second test voltage to the sensing node comprises:

providing a bit line bias signal to the page buffer to apply the first test voltage to the sensing node of the page buffer; and providing a bit line discharge signal to the page buffer to apply the second test voltage to the sensing node of the page buffer after the bit line bias signal is provided.

12. The method of claim 10, wherein applying the first test voltage and the second test voltage to the sensing node comprises:

providing a bit line discharge signal to the page buffer to apply the second test voltage to the sensing node of the page buffer; and providing a bit line bias signal to the page buffer to apply the first test voltage to the sense node of the page buffer after the bit line discharge signal is provided.

13. The method of claim 10, wherein the potential level of the sensing node is changed to the first level as the first test voltage is applied, and is changed to the second level lower than the first level as the second test voltage is applied.

* * * * *